(12) United States Patent
Depetro et al.

(10) Patent No.: US 7,417,298 B2
(45) Date of Patent: Aug. 26, 2008

(54) HIGH VOLTAGE INSULATED-GATE TRANSISTOR

(75) Inventors: Riccardo Depetro, Domodossola (IT); Stefano Manzini, Novara (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 131 days.

(21) Appl. No.: 11/078,909

(22) Filed: Mar. 9, 2005

(65) Prior Publication Data
US 2005/0205897 A1   Sep. 22, 2005

(30) Foreign Application Priority Data
Mar. 9, 2004  (EP) .................................. 04100960

(51) Int. Cl.
*H01L 29/00* (2006.01)
(52) U.S. Cl. .................. 257/510; 257/374; 257/335
(58) Field of Classification Search ................ 257/510, 257/374, 335
See application file for complete search history.

(56) References Cited

U.S. PATENT DOCUMENTS

| | | | |
|---|---|---|---|
| 4,983,535 A | 1/1991 | Blanchard | |
| 5,356,822 A | 10/1994 | Lin et al. | |
| 5,385,852 A | 1/1995 | Oppermann et al. | |
| 5,430,316 A | 7/1995 | Contiero et al. | |
| 5,701,026 A * | 12/1997 | Fujishima et al. | 257/510 |
| 6,093,588 A | 7/2000 | De Petro et al. | |
| 6,110,799 A | 8/2000 | Huang | |
| 6,252,278 B1 | 6/2001 | Hsing | |
| 6,437,399 B1 | 8/2002 | Huang | |

FOREIGN PATENT DOCUMENTS

| | | |
|---|---|---|
| EP | 0209949 | 1/1987 |
| JP | 58032462 | 2/1983 |

OTHER PUBLICATIONS

European Search Report, EP 04100960, Jul. 21, 2004.

\* cited by examiner

*Primary Examiner*—Long Pham
(74) *Attorney, Agent, or Firm*—Lisa K. Jorgenson; Paul F. Rusyn; Graybeal Jackson Haley LLP (57) ABSTRACT

An insulated-gate transistor, includes a semiconductor material layer having a front surface, a body region, an insulated gate disposed over the body region with interposition of a gate dielectric, and a source and drain region, the source region formed in the body region and the drain region formed in the semiconductor material layer. The source and drain regions are spaced apart from each other by a channel zone in a portion of the body region underlying the insulated gate, and a charge carriers drift portion of the semiconductor material layer between the channel zone and the drain region, the insulated gate extending over the charge carriers drift portion. The drain region is located at a depth compared to the front surface for causing charge carriers to move in the charge carriers drift portion away from an interface between the semiconductor material layer and the gate dielectric.

16 Claims, 5 Drawing Sheets

FIG.2J

HIGH VOLTAGE INSULATED-GATE TRANSISTOR

PRIORITY CLAIM

This application claims priority from European patent application No. EP04100960.6, filed Mar. 9, 2004, which is incorporated herein by reference.

TECHNICAL FIELD

The present invention relates, in general, to semiconductor devices, and more particularly, to high-voltage insulated-gate (e.g., Metal Oxide Semiconductor) Field Effect Transistors (shortly, MOSFETs). More specifically, the invention relates to a Double-Diffused MOS (shortly, DMOS) field effect transistor (a DMOSFET) adapted to handling high voltages.

BACKGROUND

Many solutions have been proposed to improve the performance of MOSFETs with high power-handling capability (MOSFETs capable of sustaining high voltages ranging from 3 V to about 100 V and driving large currents ranging from 100 mA to about 1 A). However, the main problem is the risk of depressing other electrical characteristics of the device such as, for example, a low internal resistance, which are as important as the capability of handling high power. Furthermore, transistors for high voltage applications have to satisfy the existing demand for compact circuits, that continually steers the microelectronics industry into submicron regions and thin-oxide circuits.

One solution to high voltage tolerance for submicron dimensions has been the development of DMOSFETs. A DMOSFET is an enhancement-mode MOS transistor having a good punch-through control, which is reached by the provision of a double diffusion of dopants through the source diffusion window. In detail, two successive diffusions of dopants of opposite type (P and N) are performed through the source diffusion window in a lightly doped substrate. A portion of the first diffusion underlies a gate oxide layer and acts as a body region, within which the channel zone for the transistor conduction current forms. The second diffusion behaves as a source region and the exploited dopants are of the same type as the dopants diffused to form the drain region.

The main limitations for high voltage transistors are due to the electrical tolerances of the gate oxide layer overlapping the channel region. The high electric field at the interface between the semiconductor and the gate oxide layer makes the transistor particularly sensitive to defects and accidental, but inevitable, contaminations of the oxide layer during manufacturing.

The application of a voltage to the gate terminal causes the contaminants migration to the point of maximum stress, i.e. the so-called edge portion of the gate oxide layer, adjacent to the drain region, experiencing the maximum voltage drop. Such a migration exacerbates the stress condition by creating an extremely high electric field proximate to the trapped ions, which causes charge injection into the gate oxide.

For this reason, the oxide/semiconductor interface close to said edge portion (adjacent to the so-called drift region) undergoes a degradation; such a degradation is more evident for devices having relatively thin gate oxide layers, which consequently suffer from significant unreliability when operating at relatively high drain voltages.

The DMOS transistors can exploit an additional lightly doped region extending from the drain region to the gate and possibly from the source region to the gate, to introduce a voltage drop between the drain and source regions and the edge of the channel, reducing the electric field across the thin gate oxide layer. However, the electric field reduction achieved by the provision of these lightly doped regions (which cannot be made too lightly doped, not to excessively increase the MOSFET conduction resistance) may not be sufficient to avoid degradation of the gate oxide.

Solutions are known in the art allowing a further reduction of the electric field across the gate oxide, such as a differentiated gate oxide thickness, providing a thicker oxide layer close to the drain region that decreases the vertical electric field at the gate edge portion; however, this simple solution does not satisfy the request for thin oxide layers.

U.S. Pat. No. 5,430,316 discloses a DMOS transistor having a further region formed under the edge portion of the gate oxide adjacent to the drain region and doped with dopants of the same type as the body region dopants. This further region forces the conduction current to move away from the surface of the device down towards a buried silicon layer, before being collected by a sinker at the drain region.

V-shaped and U-shaped grooved MOS transistors have been proposed, such as the Schottky-barrier vertical MOS transistor described in U.S. Pat. No. 4,983,535. The dopants distribution is equivalent to that of a DMOS transistor, but a trench is etched to fully penetrate the body region, and the trench surfaces oxidized to form the gate oxide; the trench is filled with polysilicon, forming the gate electrode. The conduction current of the device flows parallel to walls of the etched trench and a common drain contact is provided at the bottom of the device, inducing a vertical conduction current.

The walls of trenches resulting from an etching of the wafer inevitably present a relatively low crystallographic quality and the defects of the crystalline surface of the etched trench induce a carrier mobility degradation.

In the art, trenches in high voltage MOS transistors have also been used for other purposes. For example, U.S. Pat. No. 6,093,588 discloses a high voltage MOS transistor in which, in order to save silicon area and reduce the specific internal resistance, drain regions are formed by implanting doping species into the silicon through apertures in the field oxide. In U.S. Pat. Nos. 5,385,852 and 6,437,399 trenches are etched perpendicular to the surface of a substrate, to establish electrical contacts for reducing the transistor size and for improving the control of parasitic transistors. U.S. Pat. No. 5,356,822 discloses complementary DMOS transistors in which trenches are etched in a silicon layer for electrically isolating N and P regions on which gates are formed.

There is a need for an insulated-gate transistor that ensures great reliability at high operation voltages, has reduced geometrical dimensions and, further, has reduced parasitic effects.

SUMMARY

According to an aspect of the present invention, an insulated-gate transistor is proposed.

Briefly, the proposed insulated-gate transistor includes: a semiconductor material layer having a front surface; a body region of a first conductivity type formed in the semiconductor material layer in correspondence of the front surface; an insulated gate insulatively disposed over the body region with interposition of a gate dielectric; and a source region and a drain region of a second conductivity type opposite to the first conductivity type, the source region being formed in the body region and the drain region being formed in the semiconductor material layer, the source and the drain region being spaced apart from each other by: a channel zone in a portion of the body region underlying the insulated gate, and a charge carriers drift portion of the semiconductor material layer between the channel zone and the drain region, the insulated gate extending over the charge carriers drift portion, wherein the drain region is located at a depth compared to the front surface, for causing charge carriers to move in the charge carriers drift portion away from an interface between the semiconductor material layer and the gate dielectric.

Moreover, according to another aspect of the present invention, an integrated circuit is provided, including at least one of those insulated-gate transistors; according to still another aspect, a corresponding process for the fabrication of that insulated-gate transistor is also encompassed.

BRIEF DESCRIPTION OF THE DRAWINGS

Further features and the advantages of the present invention will be made clear by the following description of some embodiments thereof, provided purely by way of non-limitative example, description that will be conducted making reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
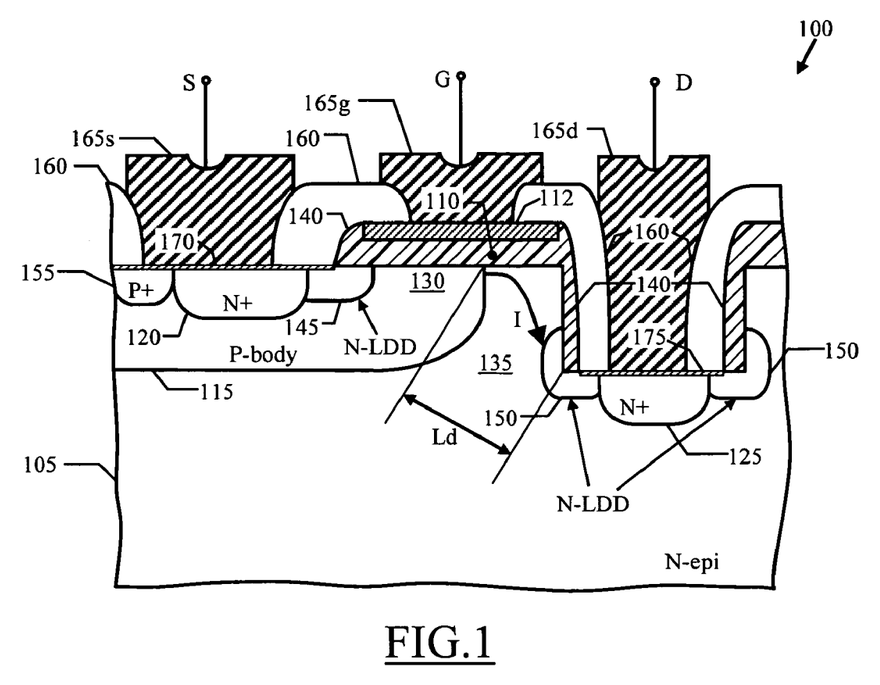
FIG. 1 shows in sectional view a portion of an N-channel DMOS transistor according to an embodiment of the present invention.

With reference to FIG. 1, a sectional view of a portion of an N-channel DMOS transistor 100 according to an embodiment of the present invention is shown. The type of doping ions (acceptor and donor dopants) in the various regions of the transistor 100 are indicated in the following, as usual in the art, by the letters P and N, respectively; the letters N and P have an added minus or plus sign to denote light or heavy doping ions concentrations.

The DMOS transistor 100 is formed on an epitaxial monocrystalline silicon layer 105, doped by N type dopants (N-epi) and grown on a silicon wafer substrate (not shown in the drawings); the transistor 100 comprises a dielectric layer 110 of silicon dioxide ($SiO_2$), formed on the surface of the epitaxial layer 105, hereinafter referred to as the gate oxide 110. Over the gate oxide 110, a conductive gate layer 112 is provided, normally made of polysilicon. The gate oxide 110 and the polysilicon layer 112 define the gate region. The gate oxide 110 separates two portions of an area on the epitaxial layer surface, which is intended to be an active area of the transistor 100.

In one of the two portions of the active area a P region 115, the so-called body region (P-body) of the transistor, is created, that extends under the gate oxide 110; a heavily N doped source region 120 is formed within the body region 115.

The other portion of the active area includes a trench obtained in the epitaxial layer 105, and a heavily N doped region 125 is provided at the bottom of the trench; the region 125 constitutes the drain region of the transistor 100.

A channel of N type carriers (i.e., electrons) for the transistor conduction current is formed during the transistor operation within a portion of the body region 115 directly underlying the gate oxide 110, hereinafter referred to as channel zone 130. The drain region 125 and the channel zone 130 are separated by a portion identified by 135 of the epitaxial layer 105 underlying the gate oxide 110.

Insulating material (e.g., $SiO_2$) sidewall spacers 140 are formed adjacent to the gate oxide 110 extending from the surface of the conductive gate layer 112; in particular, a spacer 140 is formed along the trench vertical wall adjacent to the gate region and extends down to the trench bottom wall.

A lightly N doped (N-LDD) region 145 is also provided in the body region 115 and separates the source region 120 and the channel zone 130. Similarly, a further N-LDD region 150 is provided in the epitaxial layer 105 directly adjacent to the drain region 125, and separates the drain region 125 and the portion 135 of the epitaxial layer 105. Respective portions of the N-LDD regions 145 and 150 extends under the adjacent spacer 140 and the gate oxide 110 for decreasing the voltage drop and, consequently, for reducing the oxide degradation at the gate oxide edge portions.

In the body region 115 a heavily P doped (P+) region 155 is further provided adjacent to the source region 120 on the opposite side with respect to the N-LDD region 145, which is used to contact the body region 115.

Contact windows are formed in an insulating material layer 160 overlying the surface of the transistor 100, and metal contact plugs 165s, 165g and 165d respectively contact the source region 120 and the P region 155, the conductive gate layer 112 and the drain region 125 through respective contact windows for providing the source, gate and drain terminals S, G and D. In such a structure the P body region 115 and the N source region 120 are short-circuited and, consequently, they are both biased by the voltage provided to the source terminal S.

Preferably, for improving the characteristics of the contacts between metal and doped semiconductor regions, suicide films 170 and 175 can optionally be formed over the surface of the source region 120 and the P region 155, and the N drain region 125, respectively.

By applying a suitable voltage to the gate terminal G of the MOS transistor 100, the channel of electrons for the transistor conduction current forms within the channel zone 130 directly underlying the gate oxide 110. When the drain and the source terminals D and S are properly biased, the conduction current flows towards the drain region 125 at the bottom of the trench. Thanks to the position of the drain region 125, lower than the position of the channel zone 130 relative to the surface of the transistor 100, the conduction current (indicated as I in the drawing) deviates deeply into the portion 135 of the epitaxial silicon layer 105, hereinafter referred to as drift region 135, sufficiently far away from a gate oxide/silicon interface.

Consequently, the operation of the transistor 100 is not or scarcely influenced by contaminations of the gate oxide or by imperfections of the walls of the trench; the gate oxide/silicon interface and the electrical properties of the transistor are substantially not degraded by the conduction current. Assuring high reliability, the DMOS transistor 100 withstands a relatively high voltage drop between the drain and the source terminals and a relatively great conduction current ranging from about 3 V to about 100 V and from about 100 mA to about 1 A, respectively, even if the transistor has a thin oxide layer. Furthermore, a transistor ON-resistance is relatively low and approximately of the order of $m\Omega/mm^2$; the parasitic capacitor between the gate and the drain terminals and the gate current are reduced.

In addition, the dimensions of the DMOS transistor can be very down-scaled, thanks to the fact that the conduction current flows transversely through the drift region 135 exploiting a longer drift path than a conventional DMOS.

It is pointed out that the concepts of the present invention apply as well if the dopant types are inverted; both the N-LDD regions 145 and 150 in the source and drain regions are not essential and may be dispensed for, or only one of the two regions (either the region 145 or the region 150) can be formed.

The main stages of an exemplary process for the fabrication of the transistor 100 according to an embodiment of the present invention are described hereinbelow with reference to FIGS. 2A-2J.

Figure 2A:
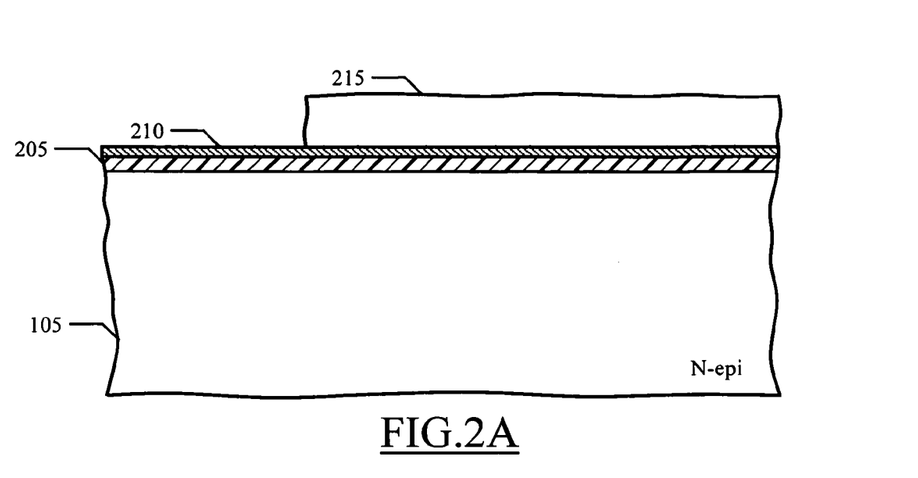
FIGS. 2A-2J are sectional views of the N-channel DMOS transistor of FIG. 1 at various stages of a fabrication process according to an embodiment of the present invention.

Referring to FIG. 2A, the N layer of monocrystalline silicon 105 is preferably formed by epitaxial growth at high temperature over the whole surface of the wafer substrate. Successively, a layer of silicon dioxide 205 is obtained at the surface of the silicon layer 105, for example, by oxidation at high temperature of a superficial thickness of the epitaxial silicon layer 105 ranging from about 20 Å to about 400 Å. Over the silicon dioxide layer 205, a conductive polycrystalline silicon layer 210 of thickness of about 1000 Å to about 5000 Å is deposited.

For defining the source region, firstly a conventional mask 215 is exploited for a lithographic etching of the excess oxide and polysilicon layers 205 and 210 overlying the intended portion of the active area where the source region has to be formed. The etching may be a wet etching or, preferably, a dry etching, e.g. RIE.

Figure 2B:
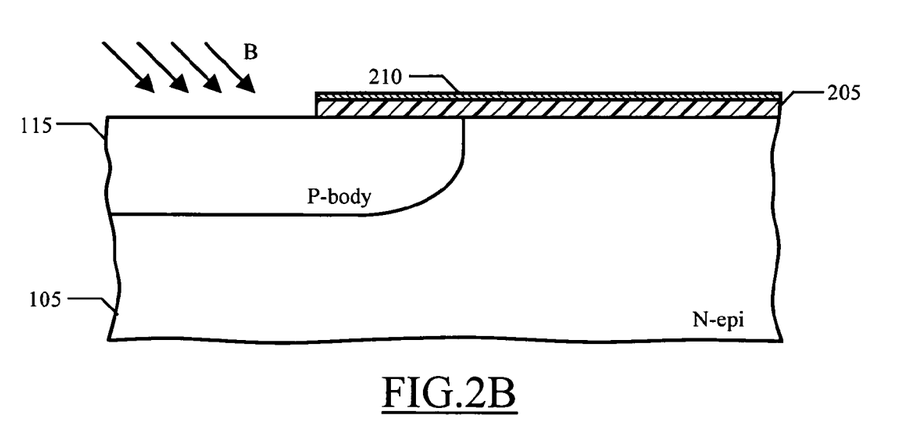

As shown in FIG. 2B, the P region 115, intended to become the body region of the transistor, is formed into the portion of the active area uncovered by the first etching; preferably, an implant of P type dopants, for example boron ions, is performed. The implant may be executed in more steps, which differ for the implant doses and energies (ranging from $1 \cdot 10^{13}$ $cm^{-2}$ to $5 \cdot 10^{13}$ $cm^{-2}$ and from 50 keV to 100 keV, respectively). Preferably, the dopants are implanted along an angled implant direction such that the P body region 115 extends partially under the residual oxide layer 205; in detail, the body region 115 may have a depth ranging from $1 \cdot 10^3$ Å to $1 \cdot 10^4$ Å and a peak dopant concentration of about $1 \cdot 10^{17}$-$1 \cdot 10^{18}$ $cm^{-3}$. A high-energy implant of dopants is preferred over a thermal diffusion, because it allows keeping small the dimensions of the transistor 100.

Figure 2C:
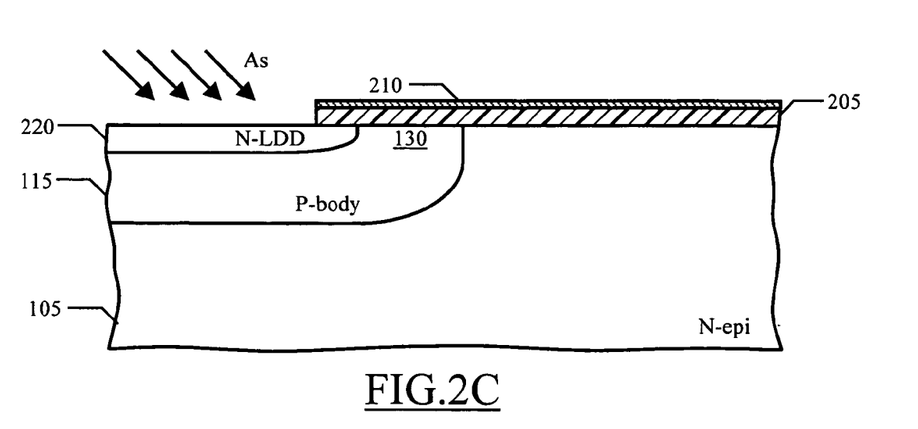

In a similar way, as illustrated in FIG. 2C, donor ions, for example phosphorus or arsenic ions, are implanted into the P body region 115 and made to diffuse towards the intended channel zone 130 under the residual oxide layer 205, so as to form an lightly doped N region 220 (N-LDD). The implant dose and energy may, for example, be of about $1 \cdot 10^{13}$-$5 \cdot 10^{13}$ $cm^{-2}$ and 30-60 keV, respectively; in this way, the region 220 has a peak donor concentration of about $1 \cdot 10^{17}$-$1 \cdot 10^{18}$ $cm^{-3}$.

Figure 2D:
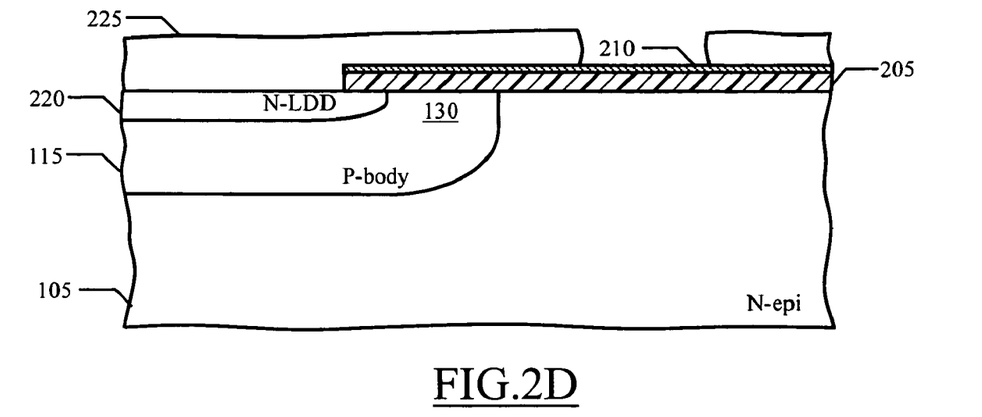

Considering FIG. 2D, a second mask 225 is used for executing an anisotropic trench etching (for example, as described in U.S. Pat. No. 6,093,588, which is incorporated herein by reference) into the portions of the oxide and polysilicon layers 205 and 210 and of the underlying epitaxial N layer 105 in the intended portion of the active area where the drain region has to be formed.

Figure 2E:
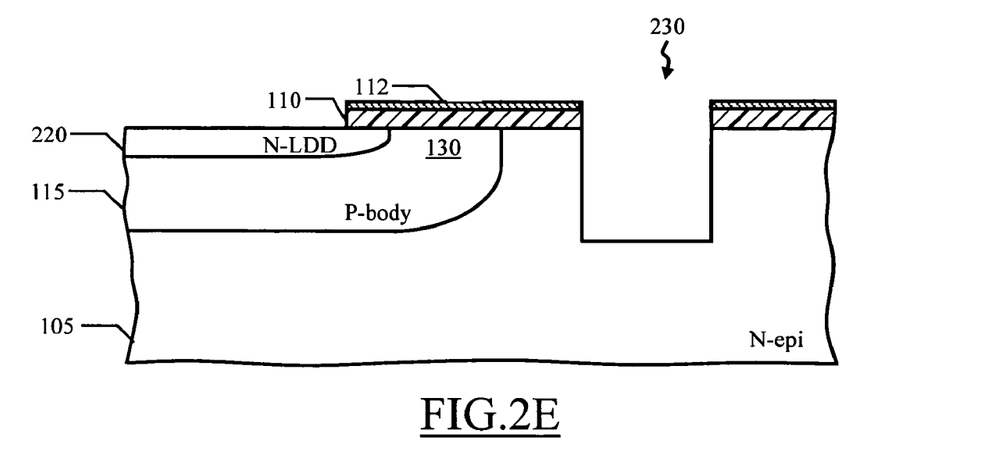

In this way, as shown in FIG. 2E, a trench 230 of a depth preferably ranging from 50 nm to 1 μm and a width ranging from 0.2 μm to 2 μm is obtained, extending roughly orthogonally to the wafer surface. At the end of this stage, the gate oxide 110 and the polysilicon gate 112 forming the gate of the transistor are defined.

Figure 2F:
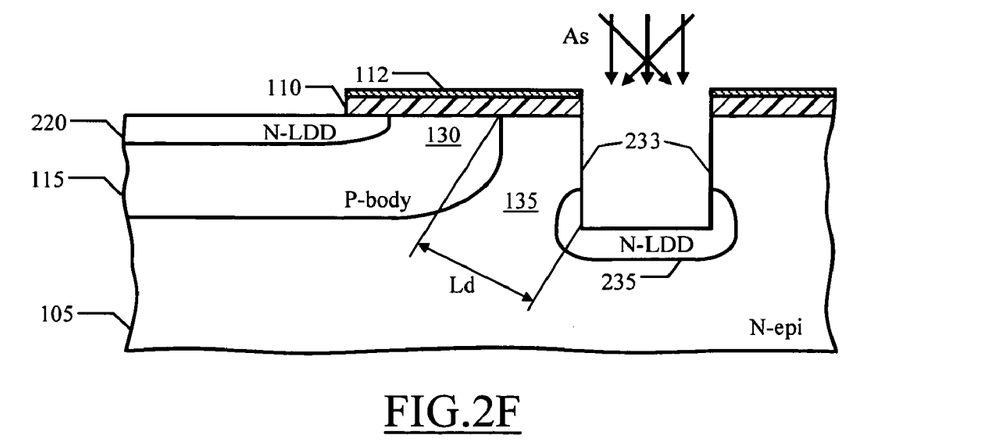

As depicted in FIG. 2F, a further implant of N type dopants (e.g., As) is executed into the drain portion of the active area, at the bottom of the trench 230, to form an drain lightly N doped (N-LDD) region 235. Also in this case, the implant may be executed in more steps and preferably with different implant angles, such that the drain N-LDD region 235 is also formed adjacent to the bottom portion of trench vertical walls 233. The distance between the N-LDD region 235 and the P body region 115 defines a length Ld of the drift region 135.

Figure 2G:
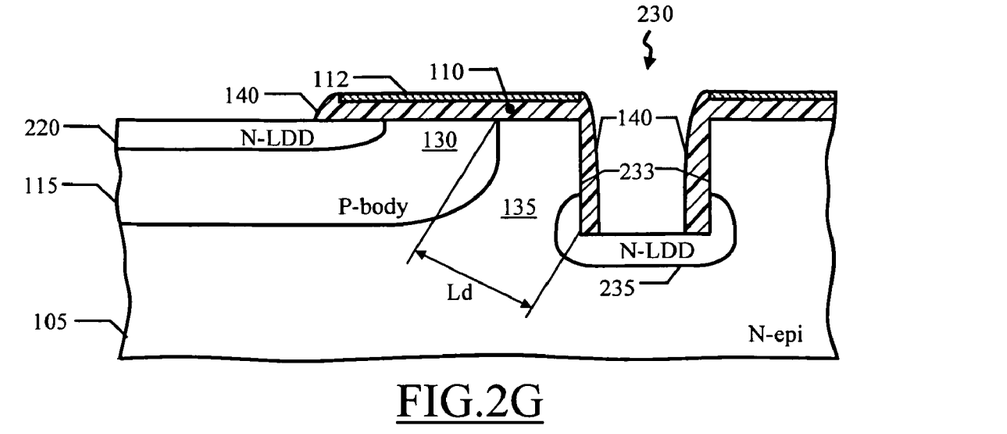

Referring to FIG. 2G, the insulating sidewall spacers 140 are then obtained, for example, by means of a selective thermal oxidation of the silicon or an oxide deposition and the etch-back thereof on the trench vertical walls 233 and laterally to the gate oxide 110 and the polysilicon gate 112.

Figure 2H:
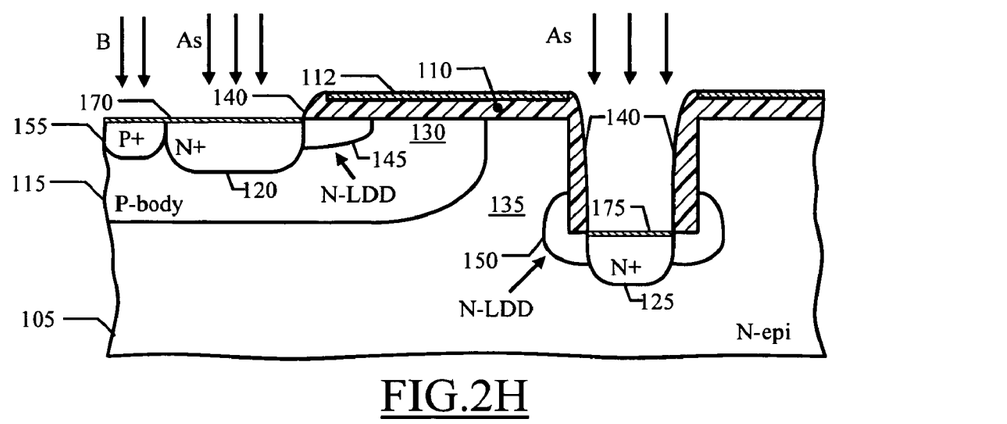

As illustrated in FIG. 2H, an implant of N type dopants (e.g., As) into the source and drain portion of the active area is performed for forming the source and drain regions 120 and 125. In the drain region 125 the implant is performed in a self-aligned way by the spacers 140 and the gate oxide 110; differently, a third mask (not shown) is used to selectively protect the body region 115, thereby the dopants are implanted only in the source region 120. In this way, also the two N-LDD regions 145 and 150 are defined. This implant is executed preferably with a dose of N type dopants of about $1 \cdot 10^{14}$-$1 \cdot 10^{15}$ $cm^{-2}$ and an implant energy ranging from about 1 keV to about 50 keV to obtain a sufficiently high dopant concentration.

Successively, a fourth mask (not shown) is used to selectively implant P type dopants into the P body region 115 for forming the P region 155 adjacent to the N source region 120 and used for properly contacting the P body region 115.

Then, a silicidation process is executed on the silicon wafer surface and the films 170 and 175 of, for example, titanium silicide are formed over the N and P regions 120 and 155 and over the N region 125, respectively.

Figure 2I:
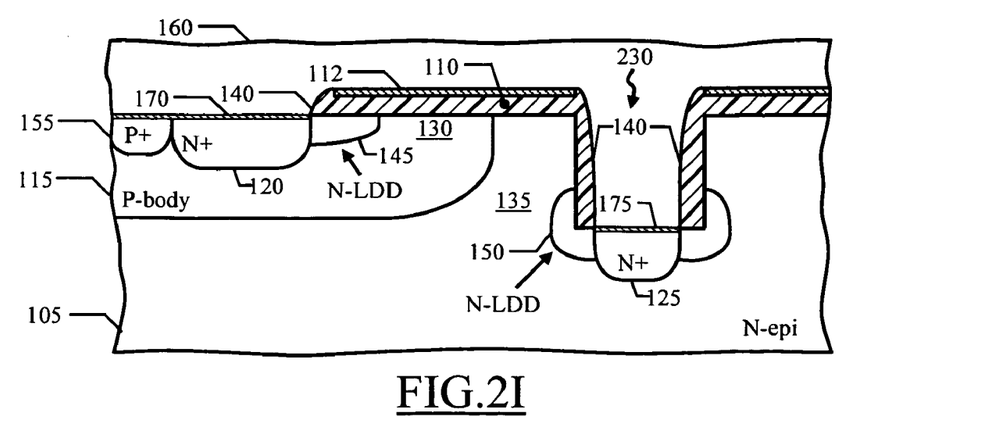

As shown in FIG. 2I, the trench 230 is then filled, and the whole surface of the wafer is covered, with the insulating material layer 160, for example, silicon dioxide, preferably using a Chemical Vapor Deposition (shortly, CVD) process.

Figure 2J:
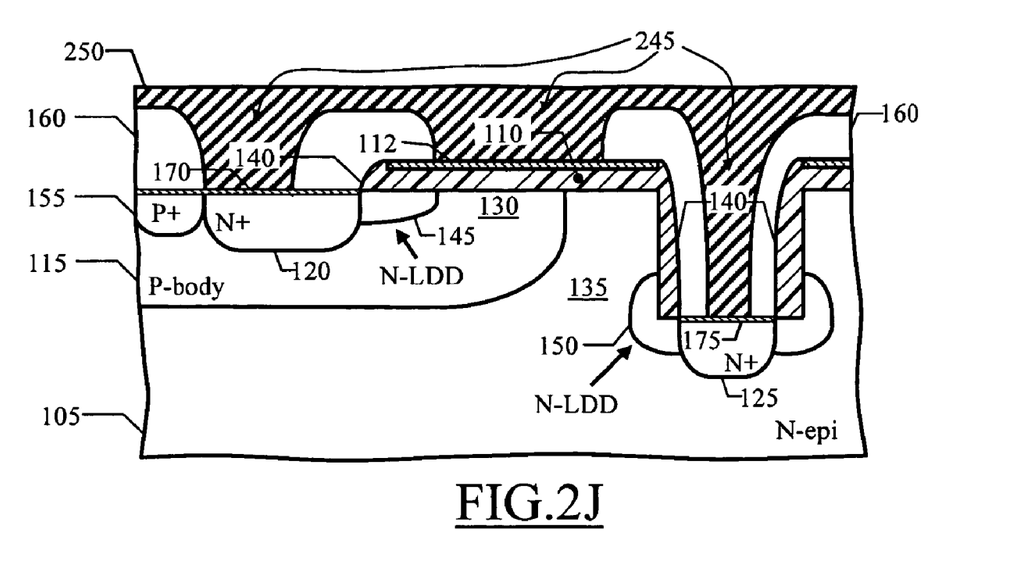

After this stage of the process, by means of a selective etching, contact windows 245 are opened in the insulating material layer 160 over the P and N source regions 120 and 155, over the N drain region 125 and over the polysilicon gate 112, as shown in FIG. 2J.

A metal layer 250, for example aluminium, is then deposited, the metal filling also the contact windows 245 for contacting the N source regions 120 and the P region 155, the N drain region 125 and the polysilicon gate 112.

Finally, by means of a further selective etching the metal layer is properly patterned for forming the source, gate and drain metal plugs 165s, 165g and 165d of the transistor 100.

The above-described process can be used also for fabricating a plurality of transistors according to embodiments of the present invention at the same time; expediently, two adjacent transistors are formed in such a way as to have the drain region or the source region in common. The process stages described above can be incorporated in a process for fabricating further different transistors or especially for fabricating (an) electronic circuit(s).

However, embodiments of the present invention can be applied also if the fabrication process of the transistor comprises additional stages or if the stages are executed in a different order and/or exploiting alternative techniques; particularly, the masks used during the process can be different in number and in type. Furthermore, alternative materials can be utilized for fabricating the device, such as different dopants, or different metals for the electric contacts, or different dielectrics.

Figure 3:
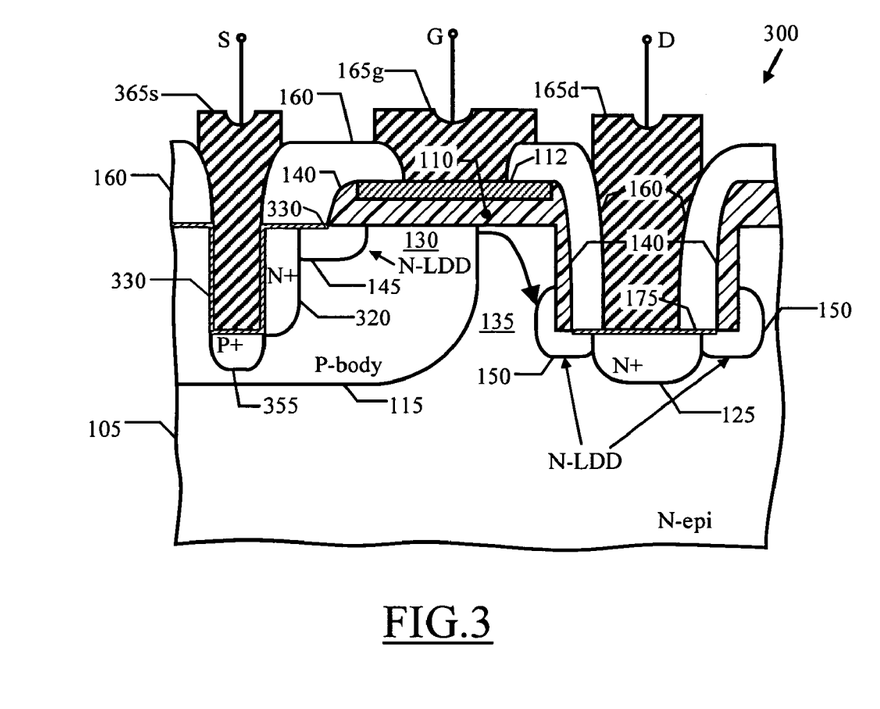
FIG. 3 illustrates in sectional view a portion of an N-channel DMOS transistor according to another embodiment of the present invention, the DMOS transistor having a vertical source contact.

FIG. 3 shows, in sectional view, a portion of an N-channel DMOS transistor 100 according to another embodiment of the present invention, having a vertical source contact (the elements corresponding to those depicted in FIG. 1 are denoted with the same reference numerals and their description is omitted for the sake of simplicity).

In addition and similarly to the trench in correspondence of the drain region, a trench is etched also in the portion of the active area, where the source region has to be formed. A heavily doped N source region 320 (N+) is formed adjacent to the vertical wall of the source trench, while a heavily doped P region 355 (P+) is formed substantially at the bottom of the source trench. Alternatively, the P region 355 may be formed adjacent to the vertical wall of the source trench opposite to the source region 320, or partly at the bottom and partly along the vertical wall of the trench.

Preferably, to improve contact characteristics, a suicide film 330 is formed on the vertical walls of the source trench and on the N-LDD region 145 and the source region 320 in correspondence of the wafer surface. The trench at the source region is filled with metal, for obtaining a vertical source metal contact plug 365s contacting the N source region 320 and the P region 355, similarly to the transistor 100 described with reference to FIG. 1.

Compared to the transistor 100 of the first embodiment, the dimensions of the DMOS transistor 300 are further reduced thanks to the provision of the trench at the source region, which allows reducing of the width of the transistor 300 by making possible a vertical contact 350 to the source region 320, instead of a surface contact as in the embodiment of FIG. 1.

It has to be observed that the transistor 300 according to the second embodiment of the present invention can be realized preferably by etching simultaneously the intended source and drain portions in the active area in the fabrication process described with reference to FIGS. 2A-2J. Then, the N-type source and drain regions 320 and 125 and the P-type region 325 are formed by means of two consecutive implants of suitable doses and energies, as described with reference to FIG. 2H. However, further stages can be added to the above-described fabrication process, or stages can be modified.

The DMOS transistors 100 and 300 may be utilized in a variety of high power applications, such as in electronic circuitry in automotive or motor control systems.

From the foregoing it will be appreciated that, although specific embodiments of the invention have been described herein for purposes of illustration, various modifications may be made without deviating from the spirit and scope of the invention.

The invention claimed is:

1. An insulated-gate transistor, including:
a semiconductor material layer having a front surface;
a body region of a first conductivity type formed in the semiconductor material layer in correspondence of the front surface;
an insulated gate insulatively disposed over the body region with interposition of a gate dielectric;
a source region and a drain region of a second conductivity type opposite to the first conductivity type, the source region being formed in the body region and the drain region being formed in the semiconductor material layer, wherein the drain region is located at a depth compared to the front surface, for causing charge carriers to move in the charge carriers drift portion away from an interface between the semiconductor material layer and the gate dielectric, and wherein the source and the drain regions are spaced apart from each other by:
a channel zone in a portion of the body region underlying the insulated gate, and
a charge carriers drift portion of the semiconductor material layer between the channel zone and the drain region, the insulated gate extending over the charge carriers drift portion;
a trench extending within the semiconductor material layer from the front surface, wherein the drain region is formed in correspondence of the trench; and
wherein the source region includes first and second source region portions, the second source region portion being adjacent to the channel zone and being less doped than the first source region portion.

2. The insulated-gate transistor according to claim 1, wherein the drain region is formed substantially at a bottom of the trench.

3. The insulated-gate transistor according to claim 1, further including a plurality dielectric material sidewall spacers formed at edges of the insulated gate.

4. The insulated-gate transistor according to claim 3, wherein the trench has a wall adjacent to one edge of the insulated gate, the dielectric material sidewall spacer formed at said one edge extending aside said wall substantially to the bottom of the trench.

5. An insulated-gate transistor, including:
a semiconductor material layer having a front surface;
a body region of a first conductivity type formed in the semiconductor material layer in correspondence of the front surface;
an insulated gate insulatively disposed over the body region with interposition of a gate dielectric;
a source region and a drain region of a second conductivity type opposite to the first conductivity type, the source region being formed in the body region and the drain region being formed in the semiconductor material layer, wherein the drain region is located at a depth compared to the front surface, for causing charge carriers to move in the charge carriers drift portion away from an interface between the semiconductor material layer and the gate dielectric, and wherein the source and the drain regions are spaced apart from each other by:
a channel zone in a portion of the body region underlying the insulated gate, and
a charge carriers drift portion of the semiconductor material layer between the channel zone and the drain region, the insulated gate extending over the charge carriers drift portion;
a trench extending within the semiconductor material layer from the front surface, wherein the drain region is formed in correspondence of the trench; and
wherein the drain region includes first and second drain region portions, the second drain region portion being adjacent to the drift region and being less doped than the first drain region portion.

6. The insulated-gate transistor according to claim 5, wherein the second drain region portion partially extends along walls of the trench.

7. The insulated-gate transistor according to claim 5, wherein the body region further includes a contact region of the first conductivity type.

8. The insulated-gate transistor according to claim 5, further including electrical contacts to the source region, the body region, the gate and the drain region, respectively.

9. The insulated-gate transistor according to claim 8, wherein the contact region and the source region are electrically connected to each other by a same electrical contact.

10. An integrated circuit comprising at least one insulated-gate transistor according to claim 1.

11. A DMOS transistor formed in a semiconductor layer having a first surface, the transistor including drain and body regions formed in the semiconductor layer along the first surface and being spaced apart from one another to define a channel region and a drift region within the body region and semiconductor layer, respectively, the DMOS transistor further including a gate oxide formed on the first surface of the semiconductor layer adjacent the channel and drift regions and the drain region, a source region formed in the body region, and a gate layer formed on the gate oxide, and wherein the DMOS transistor is operable to conduct current in a transverse direction across the drift region between the source and drain regions, and wherein the source region includes a first heavily doped region and a second lightly doped region, the second lightly doped region being adjacent to the channel region and being lightly doped relative to the first heavily doped region.

12. The DMOS transistor of claim 11 wherein the drain region has a first depth relative to the first surface and the body region has a second depth relative to the first surface, the first depth being greater than the second depth.

13. The DMOS transistor of claim 11 wherein the drain region is formed at a bottom of a trench formed in the semiconductor material, the transistor further comprising:
   insulating sidewall spacers formed along vertical sidewalls of the trench and at ends of the gate layer;
   an additional insulating layer formed within the trench on the sidewall spacers;
   a metal contact drain plug formed within the trench on the additional insulating layer and contacting drain region; and
   wherein the drain region includes a first and second lightly doped regions and a third more heavily doped region formed between the first and second lightly doped regions, the first formed adjacent the channel region and second drain region portions, the second lightly doped regions being adjacent the channel region and the first and second lightly doped regions being lightly doped relative to the third more heavily doped region.

14. The DMOS transistor of claim 11 wherein the semiconductor material, source and drain regions have a negative conductivity type and wherein the body has a positive conductivity type.

15. An electronic system, comprising:
   electronic circuitry including a DMOS transistor formed in a semiconductor layer having a first surface, the transistor including drain and body regions formed in the semiconductor layer along the first surface and being spaced apart from one another to define a channel region and a drift region within the semiconductor layer, the DMOS transistor further including a gate oxide formed on the first surface of the semiconductor layer adjacent the channel and drift regions and the drain region, a source region formed in the body region, and a gate layer formed on the gate oxide, and wherein the DMOS transistor is operable to conduct current in a transverse direction across the drift region between the source and drain regions, and wherein the source region includes a first heavily doped region and a second lightly doped region, the second lightly doped region being adjacent to the channel region and being lightly doped relative to the first heavily doped region.

16. The electronic system of claim 15 wherein the electronic circuitry comprises automotive control or motor control circuitry.

\* \* \* \* \*